United States Patent [19]

Takeoka et al.

[11] Patent Number: 4,755,424

[45] Date of Patent: Jul. 5, 1988

[54] POLYIMIDE FILM HAVING IMPROVED ADHESIVE PROPERTIES

[75] Inventors: Yoshiki Takeoka, Osaka; Hideki Kawai; Tsuneo Yamamoto, both of Ohtsu, all of Japan

[73] Assignee: Kanegafuchi Kagaku Kogyo Kabushiki Kaisha, Osaka, Japan

[21] Appl. No.: 5,050

[22] Filed: Jan. 20, 1987

[30] Foreign Application Priority Data

Jan. 23, 1986 [JP] Japan .................................. 61-12683

[51] Int. Cl.$^4$ ..................... B32B 5/16; B32B 15/08; B32B 27/06
[52] U.S. Cl. ............................... 428/323; 428/330; 428/458; 428/473.5; 428/901; 427/40
[58] Field of Search ............ 428/329, 901, 323, 473.5, 428/330, 458, 343; 427/40

[56] References Cited

U.S. PATENT DOCUMENTS 4,601,916 7/1986 Arachingi ........................... 428/901
4,612,235 9/1986 Ushimaru et al. .................. 428/329

*Primary Examiner*—Thomas J. Herbert
*Attorney, Agent, or Firm*—Armstrong, Nikaido, Marmelstein & Kubovcik

[57] ABSTRACT

A polyimide film produced by forming a film from a raw material incorporated with a finely divided inorganic powder that forms minute projections on the film surface and subsequently subjecting the film to corona discharge treatment. According to this invention, it is possible to obtain a heat-resistant polyimide film having improved adhesive properties and uniform bond strength. The film does not cause blocking when wound into a roll.

3 Claims, No Drawings

POLYIMIDE FILM HAVING IMPROVED ADHESIVE PROPERTIES

BACKGROUND OF THE INVENTION

1. Field of the Invention

The present invention relates to a heat-resistant polyimide film, and more particularly, it relates to a polyimide film having improved adhesive properties which is produced by forming a film from a raw material incorporated with a finely divided inorganic powder that forms minute projections on the film surface and subsequently subjecting the film to corona discharge treatment.

2. Description of the Prior Art

It is known that polyimide film has good heat resistance, low temperature resistance, chemical resistance, electrical insulation properties, and mechanical strength, and other good properties. It finds general use as electrical insulation film, heat insulation film, and base film of flexible printed circuit board. A polyimide film as the base film of flexible printed circuit board is bonded to a copper foil with an adhesive. There is often an instance where the bonding is poor on account of the chemical structure and high chemical (solvent) resistance of a polyimide film. At present, this drawback is mitigated by subjecting a polyimide film to surface treatment such as alkali treatment, corona discharge treatment, and sandblasting.

The conventional alkali treatment or sandblasting encounters some problems because it has to be performed separately after the film-making step and requires the additional steps of washing and drying. All this reduces productivity, increases production cost, and impairs stable production. In contrast, corona discharge treatment has an advantage over the above-mentioned two methods of treatment. It has long been used to improve the printability of paper and plastics moldings, and it can be easily performed in-line on the film-making machine because it needs only a simple apparatus.

The present inventors investigated corona discharge treatment as a means to improve the adhesive properties of polyimide film. As the result, it was found that corona discharge treatment is slightly effective in the case of polyimide film with smooth surface produced by a casting method from a raw material containing no inorganic fine particles. However, the adhesive strength improved by corona discharge treatment is generally low and uneven on the film surface. It was also found that the corona-treated film causes blocking when it is wound into a roll and that the blocking is accompanied with organic decomposition products which presumably result from the corona discharge treatment. All this indicates that the corona discharge treatment is not completely practical.

SUMMARY OF THE INVENTION

It is an object of the present invention to provide a heat-resistant polyimide film having improved adhesive properties.

It is another object of the present invention to provide a heat-resistant polyimide film having improved adhesive properties, said film having uniform adhesive strength on the film surface and causing no blocking when it is wound into a roll.

Other and further objects, features, and advantages of the invention will appear more fully from the following description.

In order to achieve the above-mentioned object, the present inventors carried out a series of researches which led to the finding that a polyimide film having practically improved adhesive properties can be obtained by producing a polyimide film from a raw material incorporated with a finely divided inorganic powder which forms minute projections on the film surface and subsequently subjecting the film to corona discharge treatment. The present invention was completed on the basis of this finding.

DETAILED DESCRIPTION OF THE INVENTION

According to this invention, the polyimide film is produced from a raw material incorporated with a finely divided inorganic powder which forms minute projections on the film surface and the film is subjected to corona discharge treatment.

The polyimide film in this invention is one which is obtained from a raw material composed solely or mainly of aromatic tetracarboxylic aicd dianhydride and aromatic diamine.

It is one feature of this invention to use a polyimide film having minute projections on the film surface. Such projections can be formed by incorporating a polyimide film with a finely divided inorganic powder. The inorganic powder is required to be stable chemically and physically throughout the entire process of producing the polyimide film. In addition, it should not adversely affect the physical properties of the polyimide film and the characteristic properties required for the application in which the polyimide film is used. With this in mind, a proper selection should be made with respect to the kind, particle size, and amount to be added. Examples of the chemical compound for the inorganic powder include $SiO_2$, $TiO_2$, $CaHPO_4$, and $Ca_2P_2O_7$. The inorganic powder should be selected from electrically insulating materials meeting the above-mentioned requirements.

The particle size of the inorganic powder should be not larger than 100 $\mu$m in particle diameter, preferably not smaller than 1 $\mu$m and not larger than 5 $\mu$m. An inorganic powder of large particle size (in excess of 5 $\mu$m) is not desirable for polyimide film which has usually a thickness of 7.5 to 125 $\mu$m, because it forms such large projections on the film surface that it decreases the mechanical strength of the resulting film. On the other hand, an excessively fine inorganic powder having a particle diameter smaller than 1 $\mu$m does not form projections of adequate size required for the improvement of adhesive properties by corona discharge treatment (mentioned later), although it affects little the mechanical properties of the polyimide film. The amount of the inorganic powder to be added varies depending on the kind of the chemical compound. In the case of $CaHPO_4$, for example, it is about 0.05 to 0.5 wt% based on the weight of the film. Too small an amount of the inorganic powder does not form the projections sufficient for the improvement of adhesive properties. An excessive amount of the inorganic powder does not uniformly disperse in the polyimide resin and consequently causes the properties of the polyimide film to fluctuate. The inorganic powder should be added in the process of polyimide film production while the polyimide resin or a precursor thereof is still fluid, in such a manner that the uniform dispersion is ensured.

The polyimide film of this invention has improved runnability because the minute projections formed on the film surface reduce the film-to-film or film-to-object contact area and consequently reduce the coefficient of friction of the film surface. According to the conventional technology, the improvement of runnability was achieved by using an inert inorganic or organic compound or catalyst residues that form projections on the film surface.

The polyimide film having projections on the surface thereof formed by the addition of inorganic powder is subjected to corona discharge treatment for the improvement of adhesive properties. The electric power for corona discharge treatment may be properly selected. It is preferably not lower than 20 W·min/m², and more preferably not lower than 50 W·min/m². Corona discharge treatment with an electric power lower than 20 W·min/m² is not enough to impart sufficient adhesive strength to polyimide film as the base film of flexible printed circuit board. An electric power in excess of 500 W·min/m² decomposes the resin on the film surface and adversely affects the film properties. The treatment with such a high electric power can only be carried out at a sacrifice of production speed. Therefore, it is not practical from the view point of productivity and production cost.

The polyimide film of this invention having surface projections is more uniform and stable in adhesive properties than the smooth polyimide film without surface projections. This is because it has good runnability as mentioned above. In other words, the polyimide film having good runnability can receive uniform corona discharge treatment because it runs smoothly without wrinkles. Conventional polyimide film, which is poor in runnability, does not undergo uniform corona discharge treatment because it runs unsmoothly and wrinkles upon contact with the film guide rolls and corona discharge roll.

According to this invention, the polyimide film with surface projections is superior in adhesive properties to the polyimide film with smooth surface. The reason for this is presumed as follows: It is generally believed that the outermost resin layer taking part in adhesion has a weak boundary layer (abbreviated as WBL hereinafter) which inhibits adhesion. This is true of polyimide film. The WBL is closely related with the lower resin layer, and it is thin on the layer formed on the projections. On the other hand, not only does the corona discharge treatment modify the surface through the introduction of oxygen-containing groups, but it also substantially removes the WBL. Therefore, the WBL formed on the surface projections is effectively removed by corona discharge treatment and the interface effective for adhesion is exposed. Thus, the film as a whole has good adhesive properties.

Polyimide film of smooth surface blocking, depositing organic decomposition products on the blocked surface, when wound into a roll after corona discharge treatment; whereas the polyimide film of this invention with surface projections does not cause blocking. Presumably, this is because the projections extremely reduce the film-to-film contact area, permitting the diffusion of organic decomposition products resulting from corona discharge treatment.

According to the present invention, it is possible to improve the adhesion of polyimide film to copper foil, which has been a problem when polyimide film is applied to its major application, flexible printed circuit board. The polyimide film of this invention is also improved in runnability. Thus, the present invention is of great industrial value for the production and use of polyimide film.

The invention is now described in more detail with reference to the following examples, which are not intended to limit the scope of this invention.

The physical properties in the examples were measured according to the following methods.

(a) Kinetic coefficient of friction (Uk) of film: Measured in the machine direction according to ASTM D-1894-63, as an index of film runnability.

(b) Adhesion strength: Measured according to JIS C-6481 (1976), Section 5.7 (method of testing the copper-clad laminate for printed circuit board). A specimen of polyimide film is bonded to a copper foil with an epoxy/nylon adhesive. After curing at 160° C. for 12 hours, the peel test was conducted, with the film fixed onto a hard board.

COMPARATIVE EXAMPLE 1

A polyimide film having a nominal thickness of 25 μm was prepared from a polyimide of the following formula produced from pyromellitic dianhydride and 4,4'-diaminodiphenyl ether.

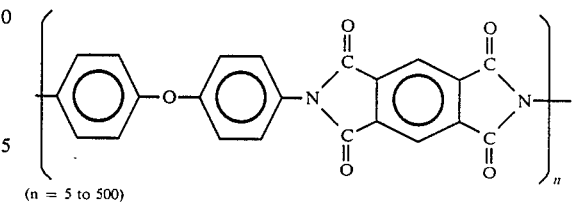

(n = 5 to 500)

COMPARATIVE EXAMPLE 2

A polyimide of the same formula as in Comparative Example 1 was incorporated with 0.15 wt% (based on resin) of anhydrous calcium secondary phosphate ($CaHPO_4$) having a particle size distribution of 1 to 5 μm, with an average particle diameter of 2.0 μm. The resulting polyimide was made into a polyimide film with surface projections having a nominal thickness of 25 μm.

COMPARATIVE EXAMPLE 3

The same polyimide film as in Comparative Example 1 was subjected to corona discharge treatment at 100 W·min/m² to give a treated polyimide film.

EXAMPLES 1 to 7

The same polyimide film as in Comparative Example 2 was subjected to corona discharge treatment at 5 to 400 W·min/m² to give treated polyimide films of different kind.

The polyimide films obtained in Comparative Examples 1 to 3 and Examples 1 to 7 were examined for bond strength and kinetic coefficient of friction. They were also examined for the presence or absence of organic decomposition products depositing on the film surface. The results are shown in Table 1.

It is noted from Table 1 that the polyimide films incorporated with an inorganic powder and subjected to corona discharge treatment are remarkably improved in adhesive properties as compared with the polyimide film which is not incorporated with an inorganic powder and not subjected to corona discharge treatment. The polyimide films in the examples are suitable for flexible printed circuit boards and many other applications.

TABLE 1

| Example No. | Amount of inorganic powder added (wt %) | Condition of corona discharge treatment (W · min/m$^2$) | Bond strength (kg/cm) | Kinetic coefficient of friction (Uk) | Deposit of organic decomposition product |
|---|---|---|---|---|---|
| Example 1 | CaHPO$_4$:0.15 | 20 | 1.7–1.9 | 0.45 | none |
| Example 2 | " | 50 | 2.0–2.2 | 0.42 | none |
| Example 3 | " | 100 | 2.4–2.6 | 0.43 | none |
| Example 4 | " | 200 | 2.5–2.8 | 0.46 | none |
| Example 5 | " | 300 | 2.6–3.0 | 0.41 | none |
| Example 6 | " | 400 | 2.6–3.0 | 0.45 | none |
| Example 7 | " | 5 | 1.2–1.3 | 0.44 | none |
| Comparative Example 1 | none | 0 | 0.5–0.7 | >0.9 | none |
| Comparative Example 2 | CaHPO$_4$:0.15 | 0 | 0.8–1.0 | 0.43 | none |
| Comparative Example 3 | none | 100 | 0.8–1.6 | >0.9 | yes |

What is claimed is:

1. A polyimide film produced by forming a polyimide film having a thickness of 7.5 to 125 μm from a raw material incorporated with a finely divided inorganic powder having a particle size of 1 to 5 μm that forms minute projections on the surface of the formed film, and subsequently subjecting the formed film to a corona discharge treatment.

2. A polyimide film as claimed in claim 1, wherein the finely divided inorganic powder is at least one selected from the group consisting of SiO$_2$, TiO$_2$, CaHPO$_4$, and Ca$_2$P$_2$O$_7$.

3. A polyimide film as claimed in claim 1, wherein the corona discharge treatment is performed at 20 to 500 W·min/m$^2$.

* * * * *